(12) United States Patent
Toba et al.

(10) Patent No.: US 7,256,476 B2
(45) Date of Patent: Aug. 14, 2007

(54) NOTCHED COMPOUND SEMICONDUCTOR WAFER

(75) Inventors: Ryuichi Toba, Akita (JP); Naoya Sunachi, Akita (JP)

(73) Assignee: Dowa Mining Co., Ltd. (JP)

( * ) Notice: Subject to any disclaimer, the term of this patent is extended or adjusted under 35 U.S.C. 154(b) by 116 days.

(21) Appl. No.: 11/267,968

(22) Filed: Nov. 7, 2005

(65) Prior Publication Data

US 2006/0060883 A1  Mar. 23, 2006

Related U.S. Application Data (62) Division of application No. 10/489,499, filed on Mar. 12, 2004, now Pat. No. 6,998,700.

(51) Int. Cl.
*H01L 29/04* (2006.01)
*H01L 31/036* (2006.01)
*H01L 29/06* (2006.01)

(52) U.S. Cl. .............. 257/627; 257/618; 257/E23.179

(58) Field of Classification Search ............... 257/618, 257/627, E23.179
See application file for complete search history.

(56) References Cited

U.S. PATENT DOCUMENTS

| | | | | |
|---|---|---|---|---|
| 6,130,461 A | * | 10/2000 | Oowaki et al. | 257/369 |
| 6,645,834 B2 | * | 11/2003 | Akiyama | 438/459 |
| 6,861,689 B2 | * | 3/2005 | Burnett | 257/296 |
| 7,115,948 B2 | * | 10/2006 | Bhattacharyya | 257/347 |
| 2004/0142579 A1 | * | 7/2004 | Morita et al. | 438/785 |
| 2004/0262667 A1 | * | 12/2004 | Bhattacharyya | 257/314 |
| 2005/0001290 A1 | * | 1/2005 | Chan et al. | 257/627 |
| 2005/0003648 A1 | * | 1/2005 | Mitani et al. | 438/612 |
| 2006/0125010 A1 | * | 6/2006 | Bhattacharyya | 257/347 |

* cited by examiner

*Primary Examiner*—Ngân V. Ngô
(74) *Attorney, Agent, or Firm*—Bachman & LaPointe

(57) ABSTRACT

There is provided a notched compound semiconductor crystal having the same specification even if it is turned over. With respect to a compound semiconductor wafer produced by slicing a compound semiconductor crystal having a crystal plane of (100) plane, the crystal is sliced so as to be tilted from the (100) plane in a direction of [101] or [10-1] when a notch is formed in a direction of [010], or the crystal is sliced so as to be tilted from the (100) plane in a direction of [0-10] or [010] when a notch is formed in a direction of [001], or the crystal is sliced so as to be tilted from the (100) plane in a direction of [001] or [00-1] when a notch is formed in a direction of [0-10], or the crystal is sliced so as to be tilted from the (100) plane in a direction of [010] or [0-10] when a notch is formed in a direction of [00-1].

5 Claims, 11 Drawing Sheets

NOTCHED COMPOUND SEMICONDUCTOR WAFER

CROSS-REFERENCE TO RELATED APPLICATION(S)

This application is a divisional application of U.S. patent application Ser. No. 10/489,499, now U.S. Pat. No. 6,998,700 filed Mar. 12, 2004, entitled NOTCHED COMPOUND SEMICONDUCTOR WAFER, By Ryuichi Toba et al.

BACKGROUND OF THE INVENTION

1. Technical Field

The present invention relates generally to a notched compound semiconductor wafer. More specifically, the invention relates to a notched compound semiconductor wafer having a plane orientation which is tilted in a predetermined direction from the orientation of a crystal plane of a compound semiconductor crystal.

2. Background Art

As semiconductor wafers (which will be hereinafter referred to as "wafers"), such as Si, GaAs and InP wafers, circular wafers are widely used. As a crystal plane for forming a device, a crystal plane about a predetermined plane orientation, such as a (100), (111) or (511) plane, is usually used. In particular, a wafer having a plane orientation coming very close to the (100) plane is important.

The ion-implantation or epitaxial growth method is used for forming a device on the surface of a wafer of GaAs or InP being a typical compound semiconductor. As a wafer used for ion-implantation, there is usually used a wafer having a plane orientation which has a tolerance of 0.5° or less from the (100) plane. On the other hand, as a wafer used for epitaxial growth, there is often used a wafer having a crystal plane which is intentionally tilted from the (100) plane in a predetermined crystal orientation, since the smoothness of the formed surface of the wafer is important. That is, since there is no atomic step on the just (100) plane in theory, flying material atoms can not find any step edges within a diffusion distance (diffusion length) on the surface, so that it is difficult to smoothly carry out growth. However, if anatomic step is formed by intentionally shifting the plane orientation of the wafer from the (100) plane, material atoms fall in the step within the diffusion length, so that there are some cases where good epitaxial growth can be carried out.

Figure 1:
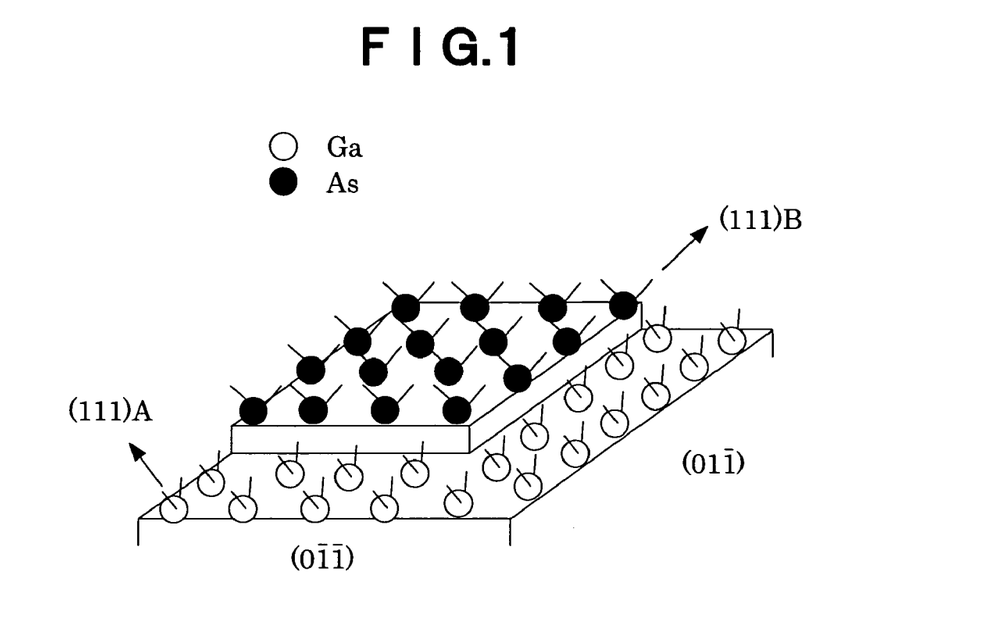
FIG. 1 is a schematic diagram showing directions of bonds of atoms on the (100) uppermost surface of a compound semiconductor of GaAs as an example of a binary compound semiconductor having a zincblende crystal structure.

FIG. 1 schematically shows the directions of bonds of atoms on the (100) uppermost surface of a compound semiconductor of GaAs as an example of a binary compound semiconductor having a zincblende crystal structure. As shown in this figure, the dangling bonds on the atomic plane of Ga extend in front and rear directions on the figure, and the dangling bonds on the atomic plane of As extend in right and left directions on the figure. In addition, the directions of the bonds of Ga atoms are parallel to a [0-1-1] direction, and the directions of the bonds of As atoms are perpendicular to the [0-1-1] direction. Therefore, the [0-1-1] direction shown in FIG. 1 has different properties from those of a [01-1] direction shown in FIG. 1. Furthermore, throughout the specification, it is assumed that a negative directional index is expressed by giving the sign "−" before a number although it is generally expressed by giving a bar above a number. Similarly, it is assumed that a coordinate of a lattice plane is expressed by giving the sign "−" before a number when it is negative.

Figure 2:
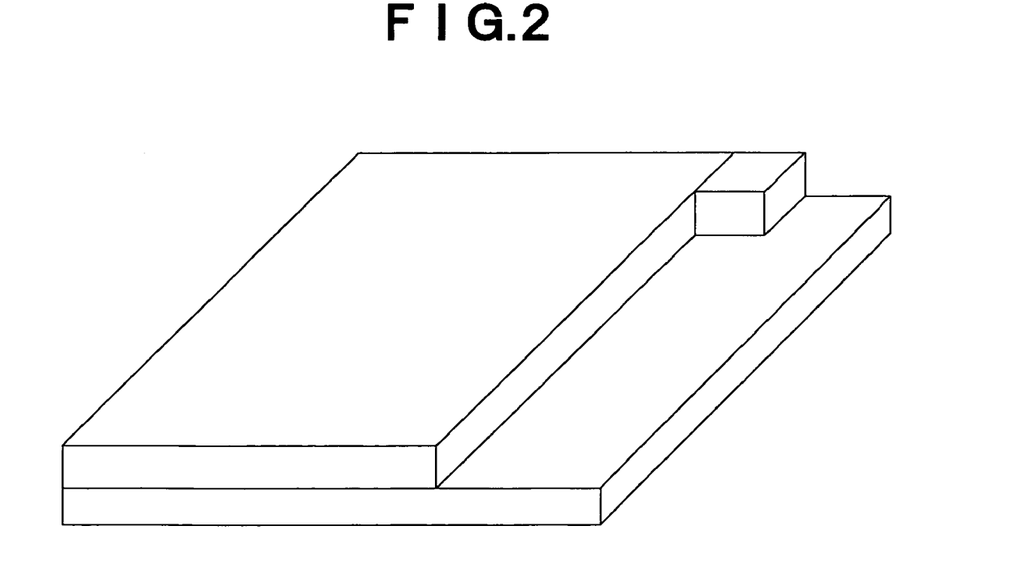
FIG. 2 is a schematic diagram showing the state of crystal growth in a step portion.

As shown in FIG. 2, if crystal growth proceeds on a step edge, the directions of bonds on the step edge influence on the crystal growth, so that a direction in which the plane orientation of a wafer is to be tilted is very important. Therefore, a direction (which will be hereinafter referred to as an "off direction"), in which the plane orientation of a wafer to be sliced is tilted, defines a crystallographic orientation as a specification of the wafer.

Figure 3:
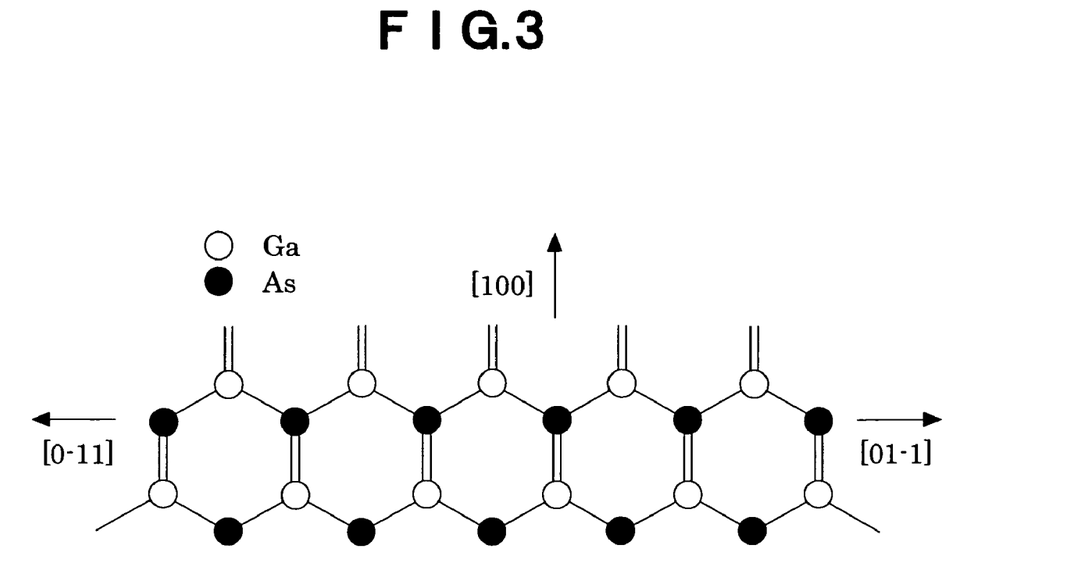
FIG. 3 is a schematic diagram showing the atomic arrangement of GaAs when a semiconductor wafer of GaAs having a crystal plane of (100) plane is viewed from the (0-1-1) side assuming that the surface of the wafer is arranged in a [100] direction.

In order to clarify a crystallographic orientation on a plane of a wafer, an orientation flat or notch is generally formed in the outer peripheral portion of the wafer. FIG. 3 shows an atomic arrangement of GaAs when a semiconductor wafer of GaAs having a crystal plane of (100) plane is viewed from the (0-1-1) side assuming that the surface of the wafer is arranged in a [100] direction. From this figure, it can be seen that the directions of the bonds of atoms on the surface of the wafer are different from those on the reverse thereof by 90°. Therefore, a typical compound semiconductor wafer has a secondary flat in addition to a primary orientation flat in order to prevent the surface and reverse thereof from being erroneously recognize.

In the case of an Si wafer formed of simple atoms, even if the surface of the wafer is mistaken for the reverse thereof before working, there is no problem since it has no anisotropy. In addition, there is little possibility that the surface of the wafer may be mistaken for the reverse thereof since only the device forming surface is mirror-finished. On the other hand, in the case of a compound semiconductor wafer, it is more difficult to work the compound semiconductor wafer than the case of the Si wafer, and the strength of the compound semiconductor wafer is weaker than that of the Si wafer. Therefore, if the compound semiconductor wafer has a diameter of four inches or more, both sides thereof are generally mirror-finished in order to meet the demands for higher working precision and strength.

Figure 4A:
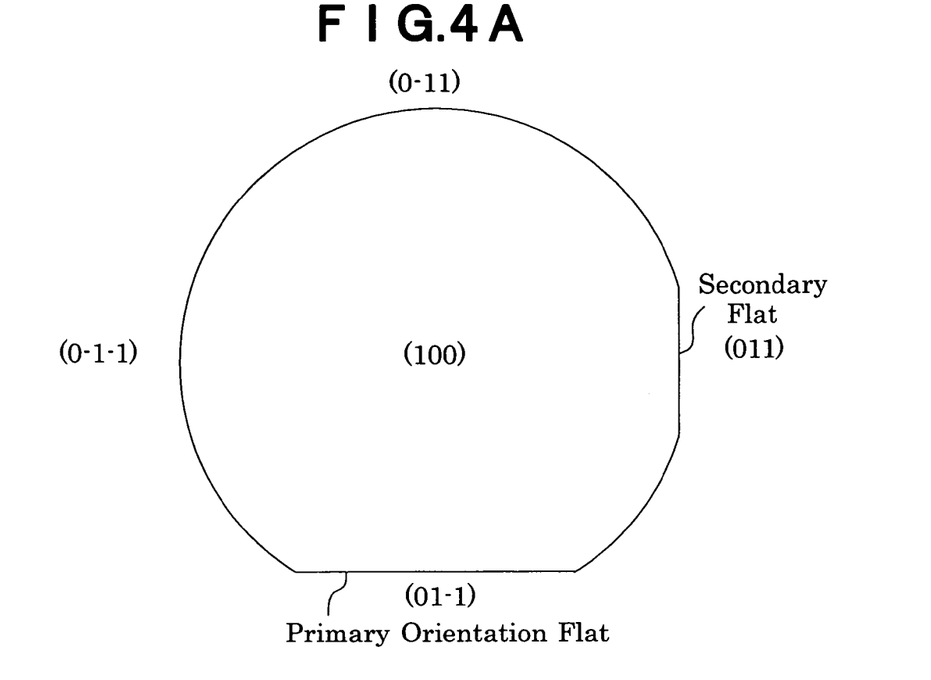
FIGS. 4A and 4B are schematic diagrams showing the position of (primary, secondary) orientation flats standardized by SEMI standard M9-0999.
Figure 4B:
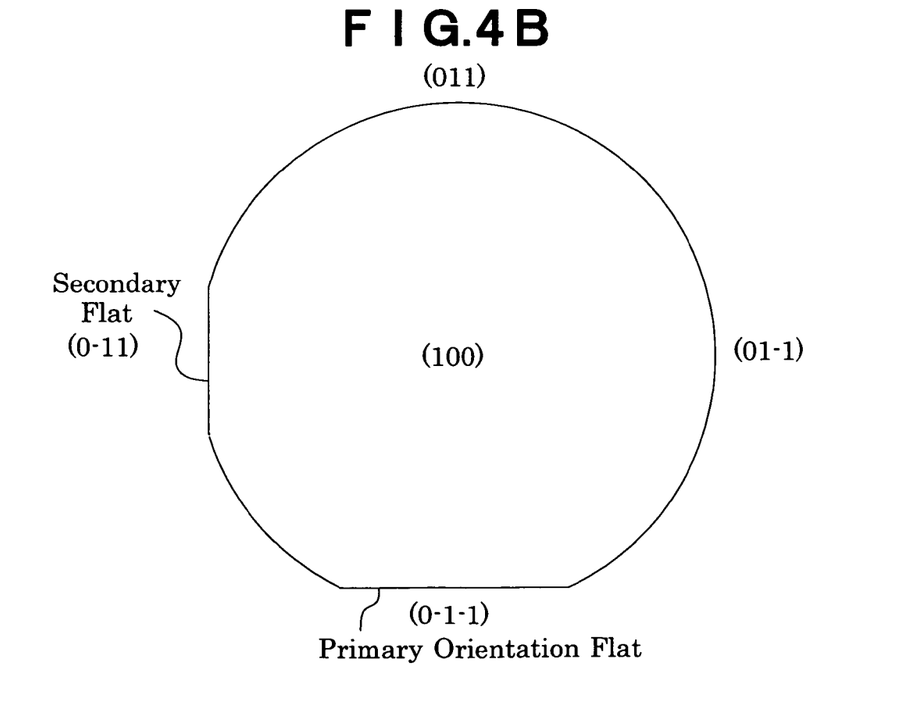

In such circumstances, the position of an orientation flat to be formed in a compound semiconductor wafer having a diameter of four inches or less is standardized. An example of such a standard is SEMI standard 9-0999. As shown in FIGS. 4A and 4B, this standard includes a so-called US (American) type standard (FIG. 4A) wherein a primary orientation flat is arranged on the (01-1) plane and a secondary orientation flat is arranged on the (011) plane, and a so-called EJ (Euro-Japanese) type standard (FIG. 4B) wherein a primary orientation flat is arranged on the (0-1-1) plane and a secondary orientation flat is arranged on the (0-11) plane.

In the case of a so-called just wafer which is sliced without being tilted from the (100) plane, it is sufficient just to conversely work the surface and reverse of the wafer, so that it is sufficient just to keep only one kind of sliced wafers as semi-finished products in stock before mirror finish.

Figure 5A:
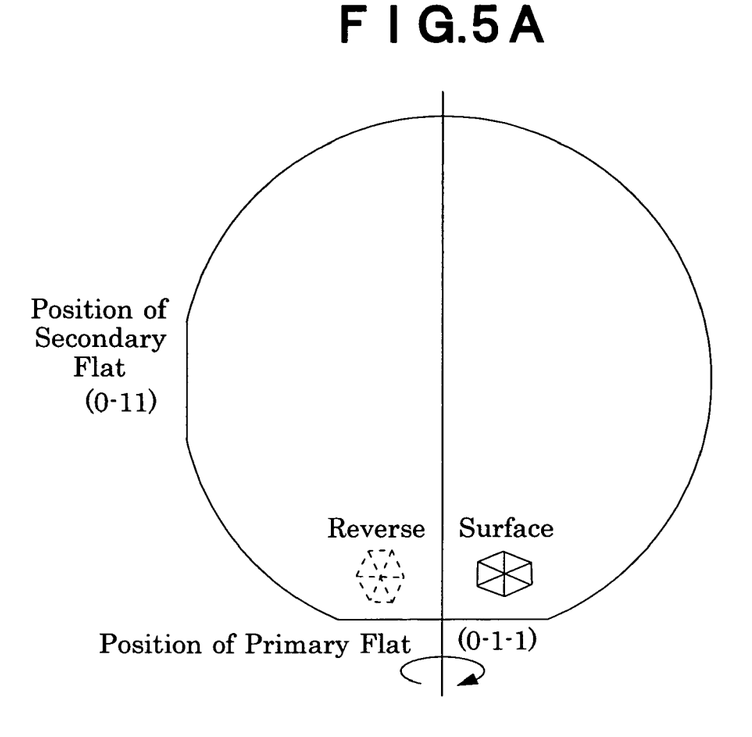
FIGS. 5A and 5B are schematic diagrams showing the relationship between the shape of an etch pit on the (100) plane of GaAs due to molten KOH etching and the crystal orientation with respect to a wafer which is sliced so as to be tilted from the (100) plane of GaAs in a predetermined orientation.
Figure 5B:
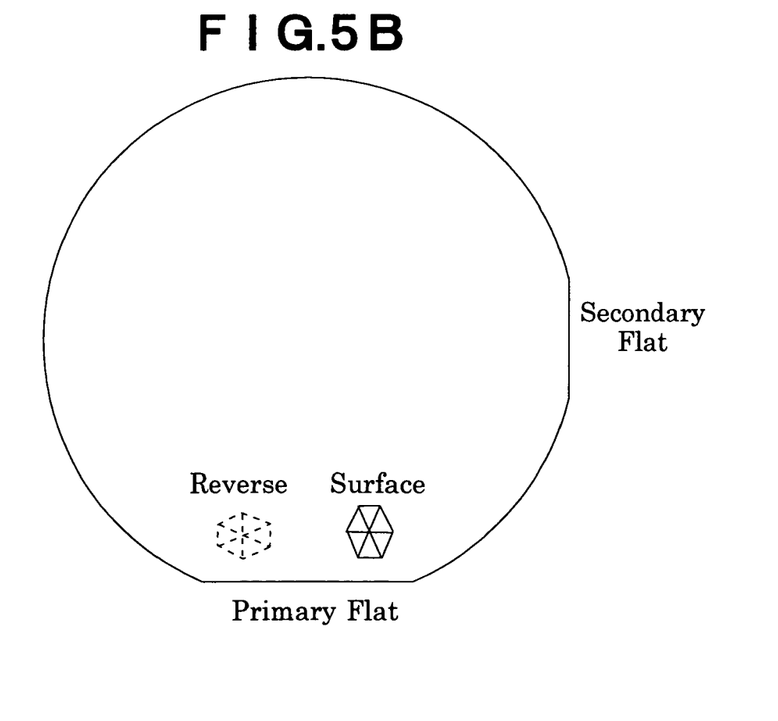

However, in the case of a wafer which is sliced so as to be tilted from the (100) plane in a predetermined direction, there is a problem in that the crystallographic orientation in the off direction varies if the wafer is turned over. For example, when a wafer having EJ type orientation flats is sliced so as to be tilted in a [0-1-1] direction in which a primary orientation flat is arranged, i.e., toward the (111) A plane, if the wafer is mistaken for a wafer having US type orientation flats to work the reverse thereof, it is tilted toward the (111) B plane with respect to the primary orientation flat. Referring to FIGS. 5A and 5B, this will be described below. FIGS. 5A and 5B show the relationship between the shape of an etch pit on the (100) plane of GaAs due to molten KOH etching and the crystal orientation. As can be seen from these figures, if the wafer is turned over, the direction of the etch pit is shifted by 90° with respect to the primary orientation flat, i.e. the crystallographic orientation is shifted by 90°, and the position of the secondary orientation flat is reversed right and left, so that the wafer becomes an absolutely different wafer. Therefore, it is not possible to cope with the wafer as a just wafer.

Figure 6A:
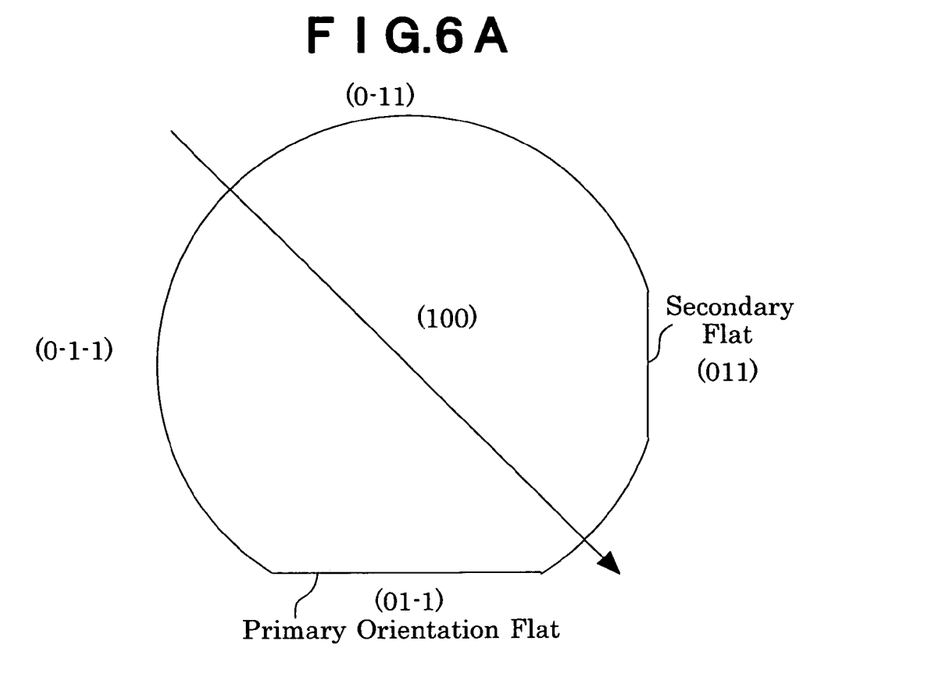
FIGS. 6A and 6B are schematic diagrams showing off directions in US type (FIG. 6A) and EJ type (FIG. 6B) when (primary, secondary) orientation flats are formed at positions standardized by SEMI standard M9-0999 and when the off direction is set to be a [100] direction.
Figure 6B:
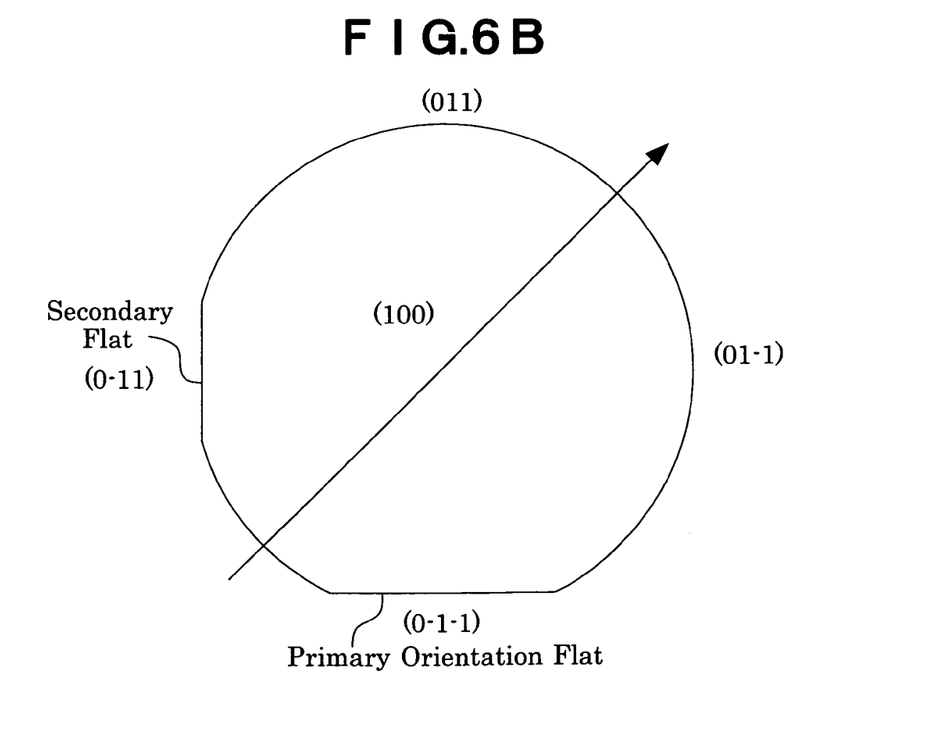

Only in a case where the wafer is sliced so as to be tilted in an intermediate direction between the (111) A plane and the (111) B plane, it is possible to obtain a crystallographically equivalent direction. However, there is a problem in that the relative off direction with respect to the orientation flat is different as shown in FIGS. 6A and 6B.

Figure 7A:
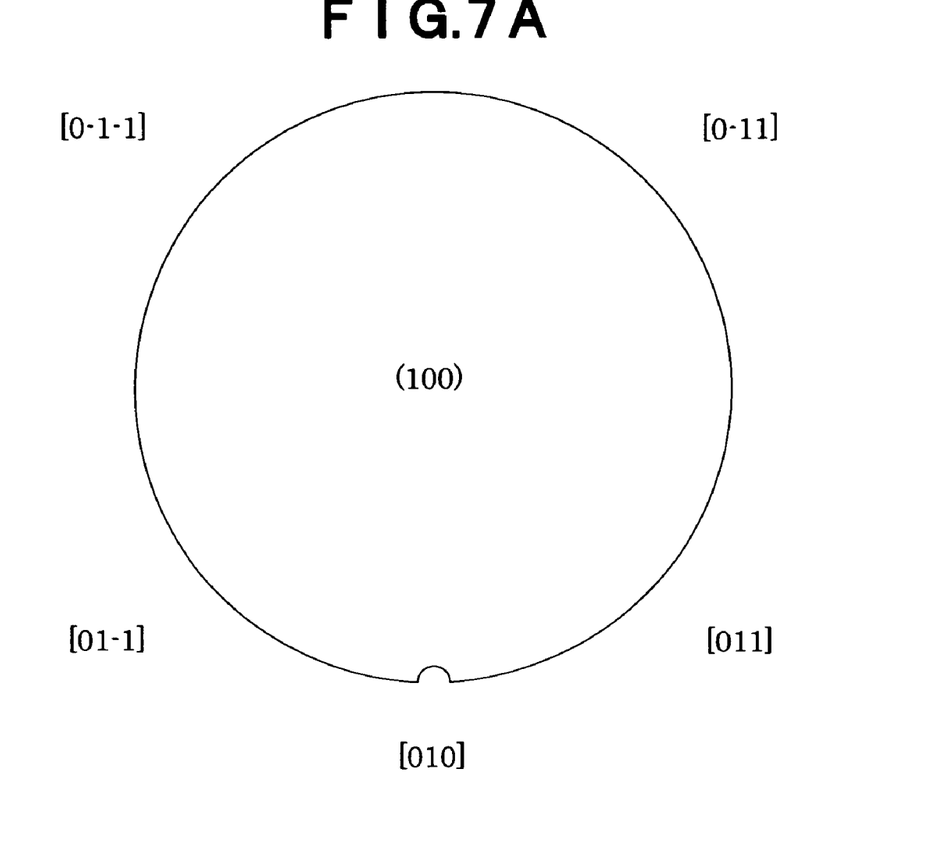
FIGS. 7A and 7B are schematic diagrams showing a notch formed at a position, which is standardized by SEMI standard M9.7-0200, in a wafer having a crystal plane of (100) plane.
Figure 7B:
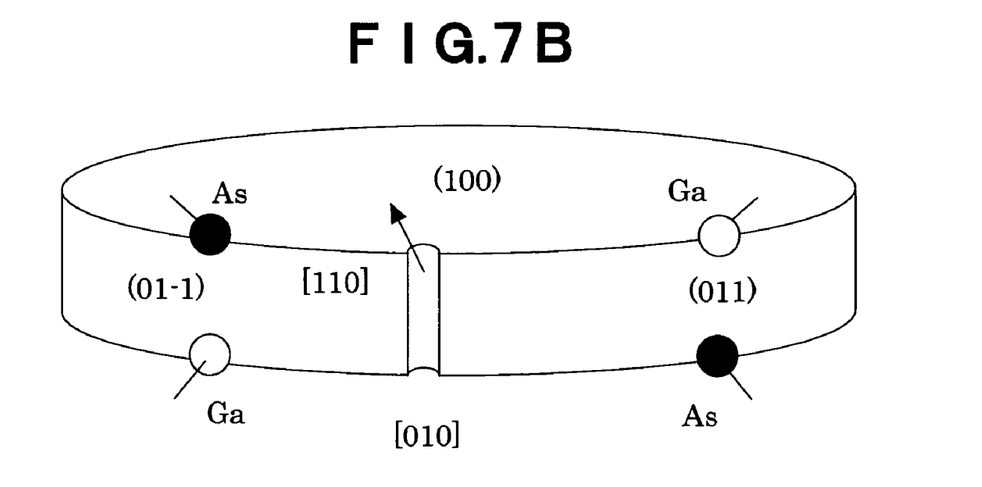

With respect to a wafer having a diameter of six inches, it was attempted to determine the position of a primary (secondary) orientation flat to define the length of a substantially similar figure, on the extended line of details of a wafer having a diameter of four inches or less. However, since the length of the primary orientation is too long, (1) the balance of the wafer in its rotation during a process is bad, (2) the temperature distribution in the wafer during a heating process is easy to be bad, and (3) the yield of a device deteriorates. In such circumstances, it is standardized by SEMI standard M9.7-0200 that a notch is provided at a place of the wafer as shown in FIGS. 7A and 7B. In this standard, it is standardized that a notch is provided at a position in a [010] direction, not at the crystallographic position of an orientation flat as a conventional notch. That is, since the notch is provided at a position in an intermediate direction between the (111) A plane and the (111) B plane as shown in FIGS. 7A and 7B, the crystallographic orientations of the notch in front and rear directions and in right and left directions are not changed even if the wafer is turned over in the case of the just (100) wafer. This standard has the merits of the fact that it is not required to identify and manage the surface and reverse of a wafer in a working process from a slicing step to a step of polishing a mirror-finished surface for forming a device thereon.

Figure 8A:
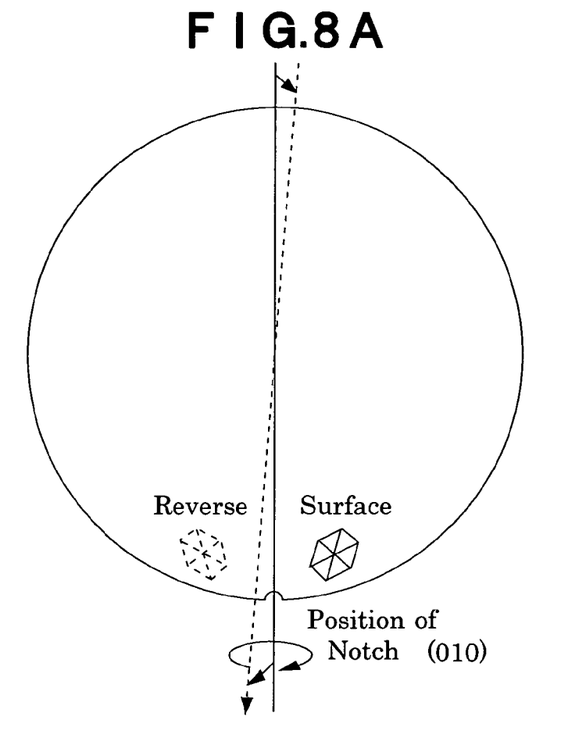
FIGS. 8A and 8B are schematic diagrams showing the relationship between the shape of an etch pit on the (100) plane of GaAs due to molten KOH etching and the crystal orientation with respect to a wafer having an off direction based on SEMI standard.
Figure 8B:
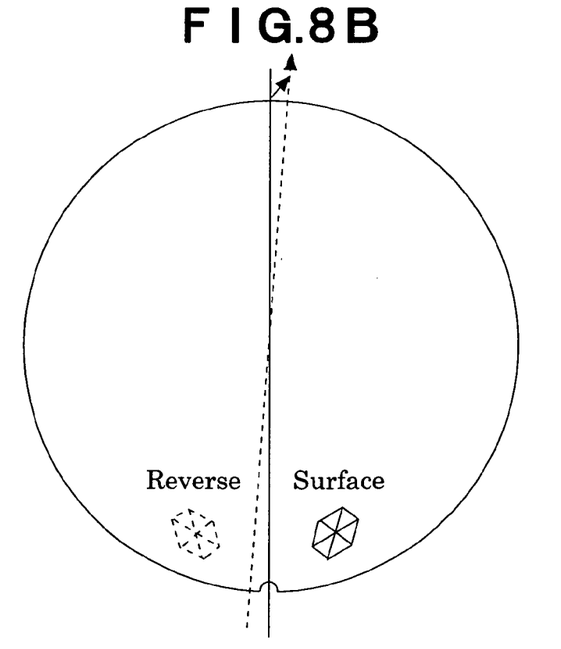

However, the above described prior art does not consider the management of the surface and reverse of a wafer sliced so as to be tilted from the (100) plane, although it can greatly lighten the load on the management of the surface and reverse of the just (100) wafer. That is, in Table 1 and FIG. 3 of SEMI standard M9.7-0200, it is standardized that a wafer is sliced so as to be tilted in a [010] direction, in which a notch is to be formed, when the wafer is sliced so as to be tilted in a direction of a group of <110> directions. In this case, as shown in FIGS. 8A and 8B, if the wafer is turned over, the off direction is the opposite direction to the direction of a notch by 180°. That is, the wafer has a different specification if the surface of the wafer is mistaken for the reverse thereof.

As described above, since both sides of a wafer having a diameter of six inches are mirror-polished, it is not easy to identify the surface and reverse of the wafer with the naked eye. Therefore, it is required to take measures to identify the surface and reverse of the wafer during a process for working the wafer, and to manage the wafer so that the wafer is not turned over. In order to take such measures, a laser marking is provided on one side of the wafer at the initial stage of the wafer working process. However, since the laser marking disappears during the polishing of the wafer unless its depth is greater than a margin for the subsequent working, it is required to deeply dig the laser marking. However, since the wafer has a thickness tolerance (usually ±10 to 20 μm), even if the laser marking is so deeply dug, there are problems in that it is difficult to see a portion for indicating a wafer lot by the laser marking and that the deeply remaining laser marking causes to damage the wafer.

As another method, there is known a method for asymmetrically chamfering the outer peripheral portions of a wafer so that the amount of chamber on the side of the surface thereof is different from that on the side of the reverse thereof, and for observing the side of the wafer to identify the surface and reverse of the wafer (see Japanese Patent Laid-Open No. 8-195366). However, this method is not always accepted by all customers since it is easy to depart from the standard shown in FIG. 7 and Table of SEMI standard M9-0999.

As a further method, there is provided a method for identifying the surface and reverse of a wafer by asymmetrically chamfering the outer peripheral portions of the wafer so that the amount of chamfer of only a notch portion on the side of the surface thereof is different from that on the side of the reverse thereof while satisfying the standard of the shape of chamber in the outer peripheral portions (see Japanese Patent Laid-Open No. 2000-331898). This method is promising as a solution. However, since the notch portion is a portion which engages an aligning pin, the slight trouble is that the rate of breakage of wafers increases in the case of a compound semiconductor, such as GaAs or InP, which is easily broken.

SUMMARY OF THE INVENTION

It is therefore an object of the present invention to eliminate the aforementioned problems and to provide a notched semiconductor wafer having the same specification at the finishing stage of a final mirror polishing process even if any excessive working for identifying the surface and reverse of the wafer and any complicated management in a process are not carried out, i.e., even if the wafer is turned over in the middle of a process.

In order to accomplish the aforementioned object, the inventors have diligently studied and concluded that the above described problems are caused by the provision that a compound semiconductor crystal having a crystal plane of (100) plane is sliced so as to be tilted in a [010] direction, in which a notch is to be formed, when the compound semiconductor crystal is sliced so as to be tilted from the (100) plane in one of a group of <110> directions. Thus, with respect to a compound semiconductor wafer produced by sliding a compound semiconductor crystal having a crystal plane of (100) plane, the inventors have found that a notched compound semiconductor wafer has the same specification even if the wafer is turned over, if the crystal is sliced so as to be tilted from the (100) plane in a [101] or [10-1] direction when a notch is formed in a [010] direction, or if the crystal is sliced so as to be tilted from the (100) plane in a [0-10] or [010] direction when a notch is formed in a [001] direction, or if the crystal is sliced so as to be tilted from the (100) plane in a [001] or [00-1] when a notch is formed in a [0-10] direction, or if the crystal is sliced so as to be tilted from the (100) plane in a [010] or [0-10] direction when a notch is formed in a [00-1] direction. Thus, the present invention has been made.

That is, a notched semiconductor wafer according to the present invention has a plane orientation tilted from the (100) plane in a [101] or [10-1] direction while it has a notch in a [010] direction, or a plane orientation tilted from the (100) plane in a [0-10] or [010] direction while it has a notch in a [001] direction, or a plane orientation tilted from the (100) plane in a [001] or [00-1] direction while it has a notch in a [0-10] direction, or a plane orientation tilted from the (100) plane in a [010] or [0-10] direction while it has a notch in a [00-1] direction.

In the notched compound semiconductor wafer, the angle of the plane orientation to be tilted from the (100) plane is preferably in the range of from ±0.5° to 15°. The inplane rotation error in a direction of the plane orientation to be tilted is preferably within ±10°. The notched compound semiconductor wafer is preferably made of a compound semiconductor having a zincblende crystal structure. The notched compound semiconductor wafer is preferably a circular compound semiconductor wafer having a diameter of 99.0 mm or more.

In a preferred embodiment of a notched compound semiconductor wafer according to the present invention, a compound semiconductor wafer to be produced by slicing a compound semiconductor crystal having a crystal plane of (100) plane is produced by slicing the compound semiconductor crystal so as to be tilted from the (100) plane in a [101] or [10-1] direction of a group of four crystallographically equivalent <110> directions when a notch is formed in a [010] direction and when the crystal is sliced so as to be tilted in an intermediate direction between the (111) A plane and the (111) B plane. Thus, even if the wafer is turned over, it is possible to maintain the working specification of the wafer including the positional relationship of the off direction with respect to the notch. As proposed directions of the notch to be formed in the compound semiconductor wafer produced by slicing the compound semiconductor crystal having the crystal plane of (100) plane, there are three proposed directions, which are [001], [0-10] and [00-1] directions, in addition to the [010] direction. When the notch is formed in the [001] direction, the crystal is sliced so as to be tilted from the (100) plane in the [0-10] or [010] direction. When the notch is formed in the [0-10] direction, the crystal is sliced so as to be tilted from the (100) plane in the [001] or [00-1] direction. When the notch is formed in the [00-1] direction, the crystal is sliced so as to be tilted from the (100) plane in the [010] or [0-10] direction. Also in these cases, the same advantageous effects can be obtained.

In a preferred embodiment of a notched compound semiconductor wafer according to the present invention, the angle (which will be hereinafter referred to as an "off angle") tilted from the (100) plane is in the range of from 0.5° to 15°. Although about ±0.5° is generally allowed as the tolerance of the off angle of a wafer, the tolerance of the off angle maybe 15° or less so as not to include undesired directions which are shifted from that in the case of the just (100) wafer. While the just (100) wafer has been used as a substrate for ion implantation, a method for tilting the wafer itself during ion implantation has been carried out in order to prevent channeling of injected impurities. In particular, when ions are injected into the surface of the wafer by scanning beams, not by parallel injection, the wafer often has an off angle of 7 to 10° to ensure uniformity as the diameter of the wafer increases. However, when ions are selectively injected into a portion beyond a pattern, if the off angle is great, shadow portions are caused to obstruct scale down which will be increasingly required in future. As measures to prevent the shadow of the pattern from being produced in the selectively injected portion, the off angle is set to be 15° or less since it is required to carry out a method for tilting the lattice plane on the side of the wafer.

Figure 9A:
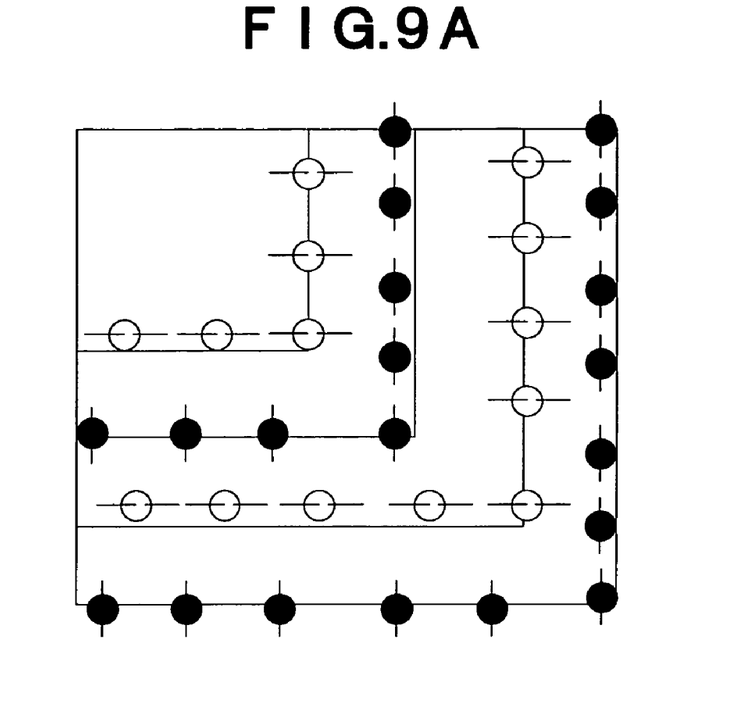
FIGS. 9A and 9B are schematic diagrams showing the state of an atomic step when a compound semiconductor wafer is sliced so as to be tilted from the (100) plane, FIG. 9A showing the state of an atomic step when the wafer is sliced so as to be tilted in the just middle direction between the (111) A plane and the (111) B plane, and FIG. 9B showing the state of an atomic step when the off direction has an inplane rotation error.
Figure 9B:
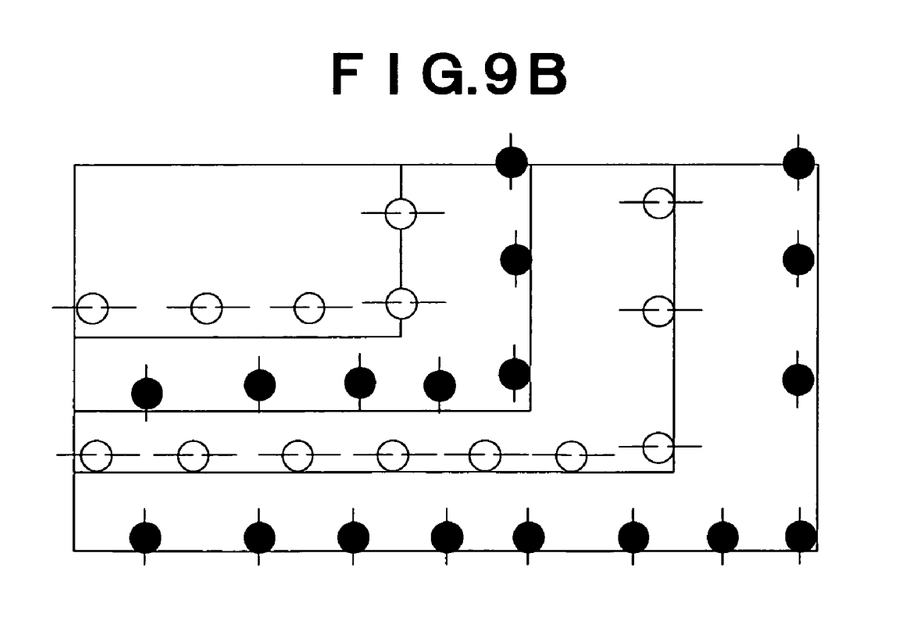

In a preferred embodiment of a notched compound semiconductor wafer according to the present invention, the inplane rotation error in the off direction is set to be within ±10°. If the error exceeds this range, the state of elements forming the step edge on the surface of the wafer is greatly different from that on the reverse thereof, to influence characteristics of an epitaxial growth film. That is, as shown in FIG. 9A, when the crystal is sliced so as to be tilted in the just middle direction between the (111) A plane and the (111) B plane, the number of atoms (shown by ●) having bonds directed toward the step on the step edge is equal to the number of atoms (shown by ○) having bonds directed toward the step on the step edge. However, if the off direction has an inplane rotation error, the number of atoms (shown by ●) directed toward the step on the step edge is greater than the number of atoms (shown by ○) directed toward the step on the step edge as shown in FIG. 9B. As described above, on the reverse side in this state, the number of atoms (shown by ○) having bonds directed toward the step is greater, so that the difference between the step states on the surface and reverse sides is emphasized. In order to avoid this, the inplane rotation error is set to be within ±10°.

A preferred embodiment of a notched compound semiconductor wafer according to the present invention is made of GaAs, InP or another compound semiconductor crystal having a zincblende crystal structure, and has a diameter of four inches or more.

According to the above described preferred embodiment of the present invention, a compound semiconductor crystal is sliced so as to be tilted from its crystal plane in a predetermined direction (a predetermined direction set in accordance with the position of a notch), so that it is possible to provide a notched semiconductor wafer having the same specification even if the wafer is turned over. Therefore, it is not required to inspect the surface and reverse of the wafer at a polishing step, so that it is possible to reduce costs.

DETAILED DESCRIPTION OF THE PREFERRED EMBODIMENT(S)

A notched semiconductor wafer according to the present invention has a plane orientation tilted from the (100) plane in a [101] or [10-1] direction while it has a notch in a [010] direction, or a plane orientation tilted from the (100) plane in a [0-10] or [010] direction while it has a notch in a [001] direction, or a plane orientation tilted from the (100) plane in a [001] or [00-1] direction while it has a notch in a [0-10] direction, or a plane orientation tilted from the (100) plane in a [010] or [0-10] direction while it has a notch in a [00-1] direction.

In the notched compound semiconductor wafer, the angle of the plane orientation to be tilted from the (100) plane is preferably in the range of from ±0.5° to 15°. The inplane rotation error in a direction of the plane orientation to be tilted is preferably within ±10°. The notched compound semiconductor wafer is preferably made of a compound semiconductor having a zincblende crystal structure. The notched compound semiconductor wafer is preferably a circular compound semiconductor wafer having a diameter of 99.0 mm or more.

Examples of notched compound semiconductor wafers according to the present invention will be described below in detail.

EXAMPLE 1

Figure 10:
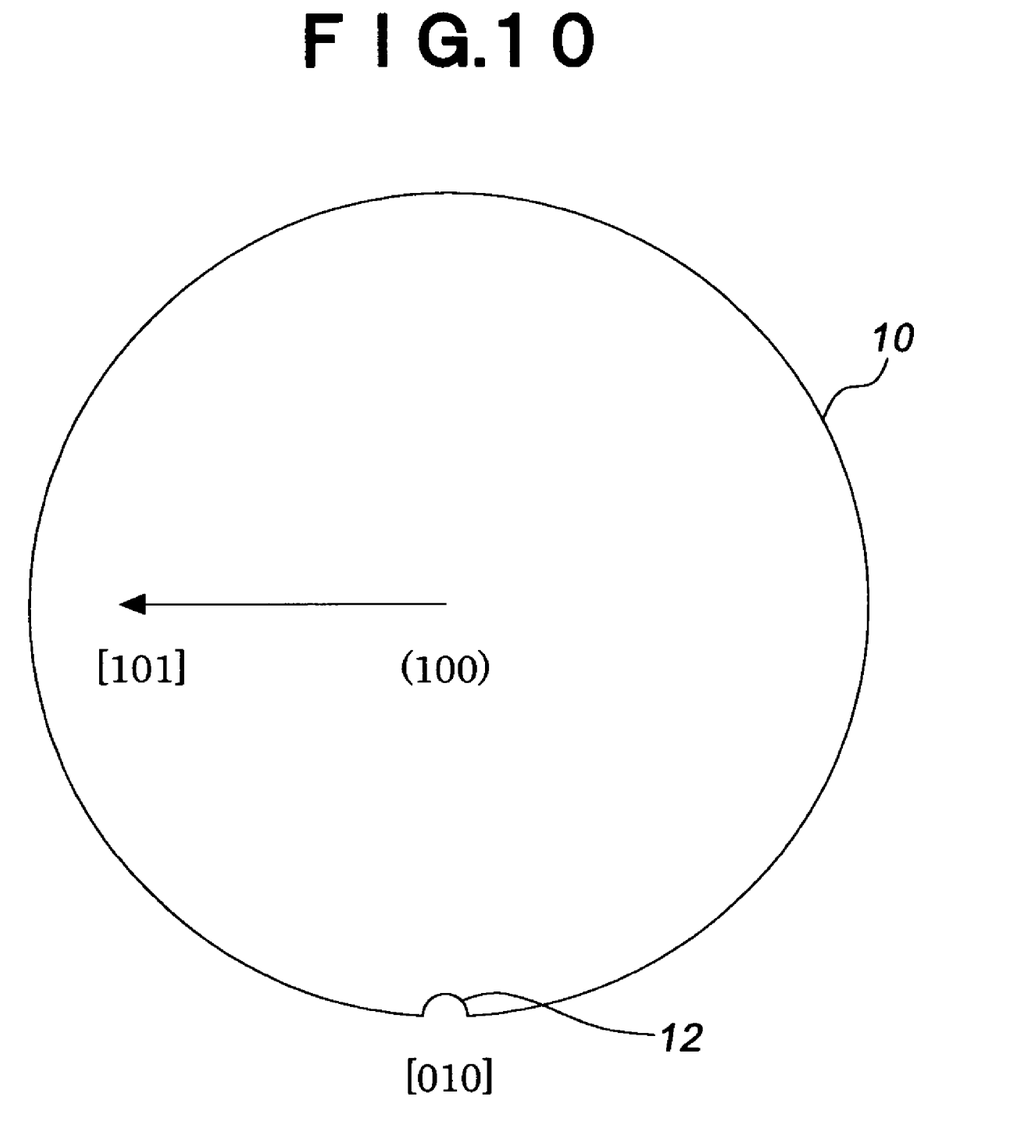
FIG. 10 is a plan view showing the off direction of a wafer and the position of a notch in Example 1.
Figure 11A:
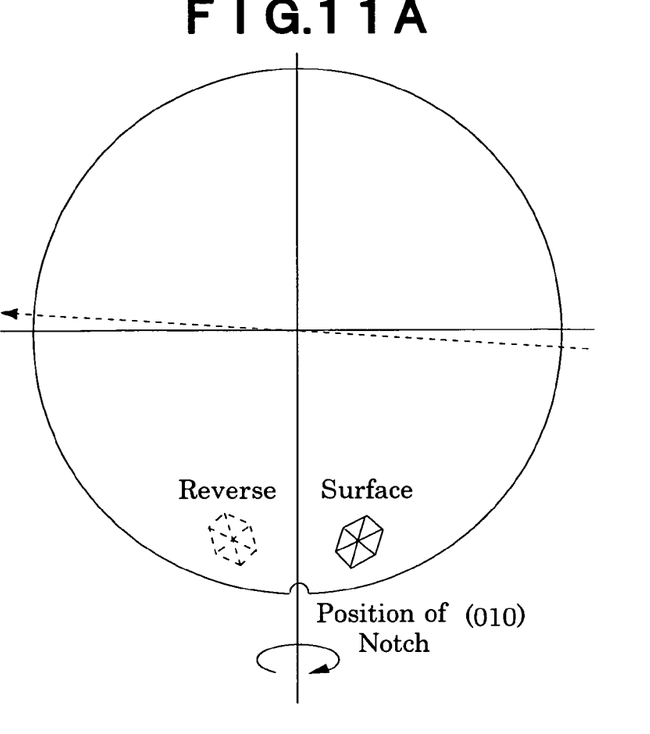
FIGS. 11A and 11B are schematic diagrams showing the relationship between the shape of an etch pit on the (100) plane of GaAs due to molten KOH etching and the crystal orientation with respect to a wafer having the off direction in Example 1.
Figure 11B:
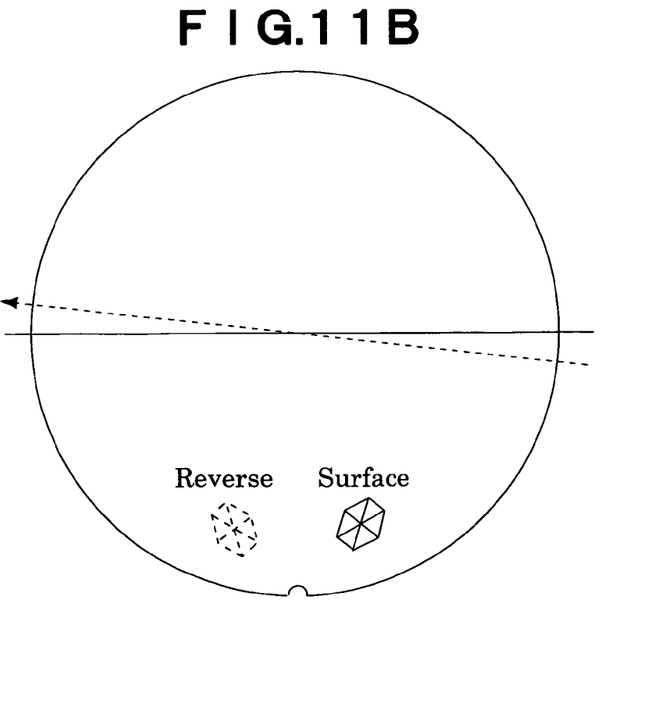
Figure 12:
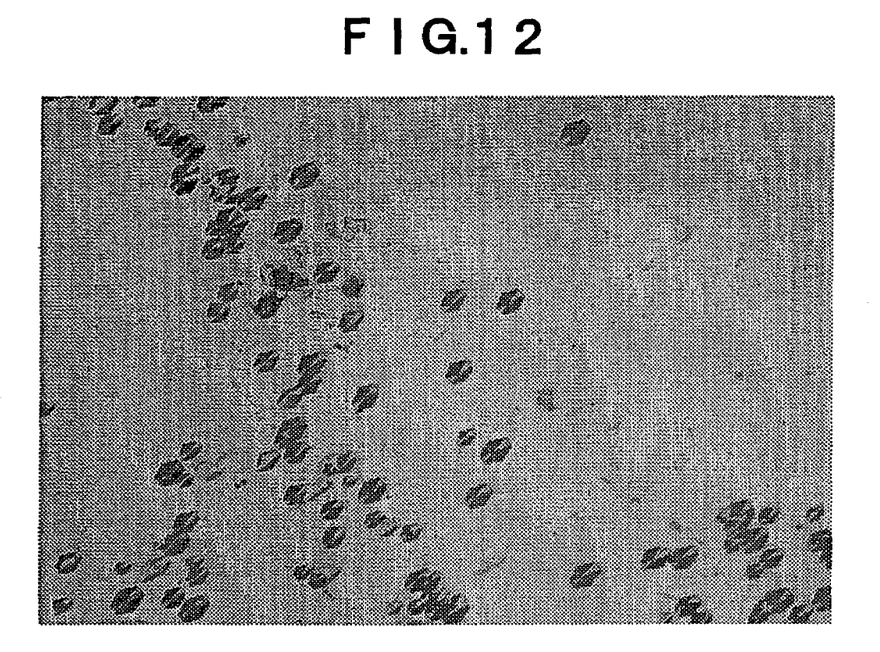
FIGS. 12 and 13 are optical microphotographs on the (100) plane of GaAs due to molten KOH etching with respect to a wafer having the off direction in Example 1, the photograph of FIG. 12 corresponding to FIG. 11A, and the photograph of FIG. 13 corresponding to FIG. 11B.
Figure 13:
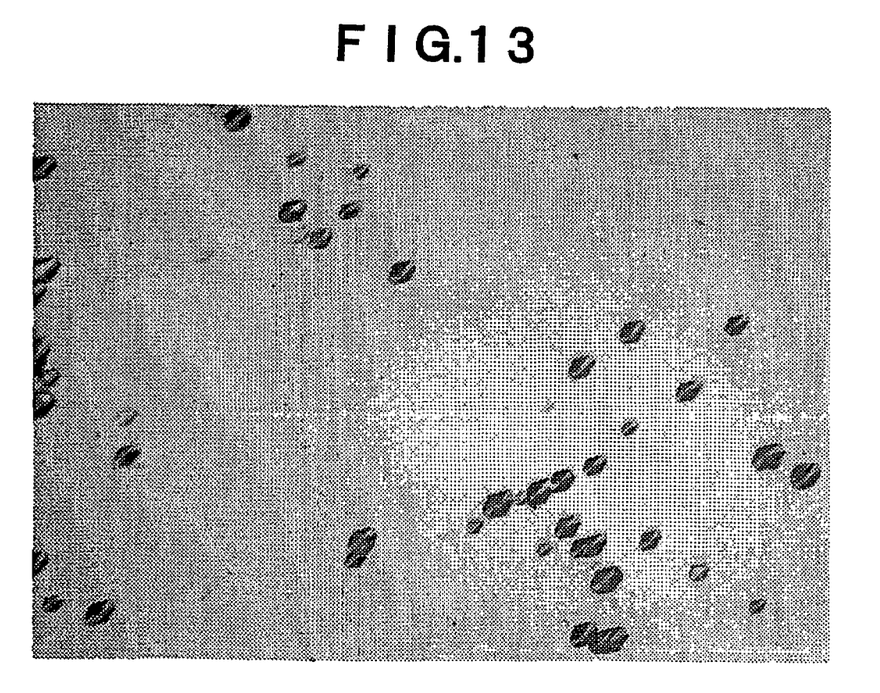

Two compound semiconductor wafers 10 of GaAs having a thickness of 800 μm and a diameter of six inches were obtained by slicing a compound semiconductor crystal of GaAs having a diameter of six inches in a direction tilted by 0.5° from the (100) plane in a [101] direction. As shown in FIG. 10, in the outer peripheral portion of each of the wafers, a notch 12 was formed in a [010] direction. Then, both sides of each of the wafers were polished so that the thickness of each of the wafers was 650 μm.

Thereafter, the two wafers were arranged so that the surface and reverse of one of the wafers were opposite to those of the other wafer. From each of the wafers, a light emitting diode (LED) was produced by carrying out processes, such as epitaxial growth, electrode formation and dice cut. After emission characteristics of the LEDs were examined, there was no problem on emission characteristics of both of the LEDs. Thus, it was verified that the semiconductor wafers obtained in this example have the same specification even if they are turned over.

The wafers produced in this example were processed by molten KOH etching to be observed by an optical microscope. As a result, as shown in FIGS. 11A, 11B, 12 and 13, even if the wafers were turned over, the off direction (left direction in this case) with respect to the notch did not vary, and the direction of a KOH etch pit did not vary. Thus, it was found that the wafers have the same crystallographic and shape specifications.

EXAMPLE 2

Light emitting diodes (LEDs) were produced by the same method as that in Example 1, except that the slicing direction was a direction tilted by 0.5° from the (100) plane in a [10-1] direction. After emission characteristics of the LEDs were examined, there was no problem on emission characteristics of both of the LEDs. Thus, it was verified that the semiconductor wafers obtained in this example have the same specification even if they are turned over. The results of observation by an optical microscope were the same as those in Example 1.

EXAMPLE 3

Two compound semiconductor wafers of GaAs having a thickness of 800 μm and a diameter of six inches were obtained by slicing a compound semiconductor crystal of GaAs having a diameter of six inches in a direction tilted by 0.5° from the (100) plane in a [0-10] direction. In the outer peripheral portion of each of the wafers, a notch was formed in a [001] direction. Then, both sides of each of the wafers were polished so that the thickness of each of the wafers was 650 μm. Thereafter, the two wafers were arranged so that the surface and reverse of one of the wafers were opposite to those of the other wafer. From each of the wafers, a light emitting diode (LED) was produced by carrying out processes, such as epitaxial growth, electrode formation and dice cut. After emission characteristics of the LEDs were examined, there was no problem on emission characteristics of both of the LEDs. Thus, it was verified that the semiconductor wafers obtained in this example have the same specification even if they are turned over. The results of observation by an optical microscope were the same as those in Example 1.

EXAMPLE 4

Light emitting diodes (LEDs) were produced by the same method as that in Example 3, except that the slicing direction was a direction tilted by 0.5° from the (100) plane in a [010] direction. After emission characteristics of the LEDs were examined, there was no problem on emission characteristics of both of the LEDs. Thus, it was verified that the semiconductor wafers obtained in this example have the same specification even if they are turned over. The results of observation by an optical microscope were the same as those in Example 1.

EXAMPLE 5

Two compound semiconductor wafers of GaAs having a thickness of 800 μm and a diameter of six inches were obtained by slicing a compound semiconductor crystal of GaAs having a diameter of six inches in a direction tilted by 0.5° from the (100) plane in a [001] direction. In the outer peripheral portion of each of the wafers, a notch was formed in a [0-10] direction. Then, both sides of each of the wafers were polished so that the thickness of each of the wafers was 650 μm. Thereafter, the two wafers were arranged so that the surface and reverse of one of the wafers were opposite to those of the other wafer. From each of the wafers, a light emitting diode (LED) was produced by carrying out processes, such as epitaxial growth, electrode formation and dice cut. After emission characteristics of the LEDs were examined, there was no problem on emission characteristics of both of the LEDs. Thus, it was verified that the semiconductor wafers obtained in this example have the same specification even if they are turned over. The results of observation by an optical microscope were the same as those in Example 1.

EXAMPLE 6

Light emitting diodes (LEDs) were produced by the same method as that in Example 5, except that the slicing direction was a direction tilted by 0.5° from the (100) plane in a [00-1] direction. After emission characteristics of the LEDs were examined, there was no problem on emission characteristics of both of the LEDs. Thus, it was verified that the semiconductor wafers obtained in this example have the same specification even if they are turned over. The results of observation by an optical microscope were the same as those in Example 1.

EXAMPLE 7

Two compound semiconductor wafers of GaAs having a thickness of 800 μm and a diameter of six inches were obtained by slicing a compound semiconductor crystal of GaAs having a diameter of six inches in a direction tilted by 0.5° from the (100) plane in a [010] direction. In the outer peripheral portion of each of the wafers, a notch was formed in a [00-1] direction. Then, both sides of each of the wafers were polished so that the thickness of each of the wafers was 650 μm. Thereafter, the two wafers were arranged so that the surface and reverse of one of the wafers were opposite to those of the other wafer. From each of the wafers, a light emitting diode (LED) was produced by carrying out processes, such as epitaxial growth, electrode formation and dice cut. After emission characteristics of the LEDs were examined, there was no problem on emission characteristics of both of the LEDs. Thus, it was verified that the semiconductor wafers obtained in this example have the same specification even if they are turned over. The results of observation by an optical microscope were the same as those in Example 1.

EXAMPLE 8

Light emitting diodes (LEDs) were produced by the same method as that in Example 7, except that the slicing direction was a direction tilted by 0.5° from the (100) plane in a [0-10] direction. After emission characteristics of the LEDs were examined, there was no problem on emission characteristics of both of the LEDs. Thus, it was verified that the semiconductor wafers obtained in this example have the same specification even if they are turned over. The results of observation by an optical microscope were the same as those in Example 1.

What is claimed is:

1. A notched compound semiconductor wafer which has a plane orientation tilted from a (100) plane in a [001] or [00-1] direction and which has a notch in a [0-10] direction.

2. A notched compound semiconductor wafer as set forth in claim 1, wherein an angle of the plane orientation to be tilted from the (100) plane is in the range of from ±0.5° to 15°.

3. A notched compound semiconductor wafer as set forth in claim 1, wherein an inplane rotation error in a direction of the plane orientation to be tilted is within ±10°.

4. A notched compound semiconductor wafer as set forth in claim 1, which is made of a compound semiconductor having a zincblende crystal structure.

5. A notched compound semiconductor wafer as set forth in claim 1, which is a circular compound semiconductor wafer having a diameter of at least 99.0 mm.

* * * * *